(12) United States Patent
Hsieh et al.

(10) Patent No.: US 10,950,771 B2
(45) Date of Patent: Mar. 16, 2021

(54) LIGHT-EMITTING DEVICE

(71) Applicant: EPISTAR CORPORATION, Hsinchu (TW)

(72) Inventors: Min-Hsun Hsieh, Hsinchu (TW); Biing-Jye Lee, Hsinchu (TW); Yih-Hua Renn, Hsinchu (TW); Jai-Tai Kuo, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/820,393

(22) Filed: Mar. 16, 2020

(65) Prior Publication Data
US 2020/0220061 A1    Jul. 9, 2020

Related U.S. Application Data

(63) Continuation of application No. 15/867,315, filed on Jan. 10, 2018, now Pat. No. 10,593,849, which is a (Continued)

(51) Int. Cl.
| | |
|---|---|
| H01L 33/62 | (2010.01) |
| H01L 33/64 | (2010.01) |
| H01L 33/60 | (2010.01) |
| H01L 33/52 | (2010.01) |
| H01L 33/56 | (2010.01) |
| H01L 33/54 | (2010.01) |
| H01L 33/50 | (2010.01) |
| H01L 33/48 | (2010.01) |

(52) U.S. Cl.
CPC .............. *H01L 33/62* (2013.01); *H01L 33/52* (2013.01); *H01L 33/54* (2013.01); *H01L 33/56* (2013.01); *H01L 33/60* (2013.01); *H01L 33/642* (2013.01); *H01L 33/486* (2013.01); *H01L 33/50* (2013.01); *H01L 33/507* (2013.01); *H01L 33/641* (2013.01); *H01L 33/647* (2013.01); *H01L 2224/16245* (2013.01); *H01L 2924/181* (2013.01)

(58) Field of Classification Search
CPC ......... H01L 33/62; H01L 33/56; H01L 33/54; H01L 33/52; H01L 33/642; H01L 33/60; H01L 33/507; H01L 33/50; H01L 2224/16245; H01L 2924/181; H01L 33/641; H01L 33/647; H01L 33/486
See application file for complete search history.

(56) References Cited

U.S. PATENT DOCUMENTS

| 7,897,991 B2 | 3/2011 | Chang |
| 8,575,632 B2 | 11/2013 | Kuramoto et al. |
| (Continued) | | |

FOREIGN PATENT DOCUMENTS

WO    WO 2013/151391 A1    10/2013

*Primary Examiner* — Victor A Mandala
(74) *Attorney, Agent, or Firm* — Muncy, Geissler, Olds and Lowe, P.C.

(57) ABSTRACT

A light-emitting device includes a heat-dissipating structure having a first part and a second part separated from the first part; a light-emitting unit including a light-emitting element with a first pad formed on the first part; and a first transparent enclosing the light-emitting element and having a sidewall; and an adhesive material covering a portion of the sidewall.

10 Claims, 12 Drawing Sheets

Related U.S. Application Data continuation of application No. 14/721,599, filed on May 26, 2015, now Pat. No. 9,876,152.

(60) Provisional application No. 62/003,262, filed on May 27, 2014.

(56) References Cited

U.S. PATENT DOCUMENTS

| | | | |
|---|---|---|---|
| 9,343,444 B2* | 5/2016 | Tischler | H01L 33/505 |
| 2003/0025657 A1 | 2/2003 | Iwafuchi | |
| 2006/0125113 A1 | 6/2006 | Liu et al. | |
| 2007/0057364 A1* | 3/2007 | Wang | H01L 33/642 |
| | | | 257/701 |
| 2007/0267650 A1* | 11/2007 | Hsieh | H01L 33/38 |
| | | | 257/99 |
| 2008/0123337 A1* | 5/2008 | Higashi | F21K 9/00 |
| | | | 362/267 |
| 2008/0237624 A1* | 10/2008 | Kang | H01L 33/486 |
| | | | 257/99 |
| 2009/0196011 A1 | 8/2009 | Kobayashi et al. | |
| 2010/0140811 A1 | 6/2010 | Leal et al. | |
| 2011/0291145 A1 | 12/2011 | Han et al. | |
| 2011/0297983 A1 | 12/2011 | Nishiuchi et al. | |
| 2013/0049045 A1* | 2/2013 | Lee | H01L 33/505 |
| | | | 257/98 |
| 2013/0056773 A1* | 3/2013 | Yang | H01L 33/647 |
| | | | 257/98 |
| 2014/0239331 A1 | 8/2014 | Oyu et al. | |
| 2014/0264401 A1 | 9/2014 | Brooks et al. | |
| 2014/0264424 A1 | 9/2014 | Brooks et al. | |
| 2015/0091035 A1 | 4/2015 | Kim et al. | |
| 2015/0200336 A1* | 7/2015 | Bhat | H01L 33/62 |
| | | | 257/98 |
| 2015/0325748 A1* | 11/2015 | Ting | H01L 33/38 |
| | | | 257/98 |
| 2016/0254428 A1* | 9/2016 | Ting | H01L 33/0093 |
| | | | 257/99 |
| 2017/0125645 A1* | 5/2017 | Ting | H01L 33/38 |
| 2017/0141276 A1* | 5/2017 | Yamada | H01L 33/60 |

* cited by examiner

LIGHT-EMITTING DEVICE

CROSS-REFERENCE TO RELATED APPLICATIONS

This application is a Continuation of co-pending application Ser. No. 15/867,315, filed on Jan. 10, 2018, which is a Continuation of application Ser. No. 14/721,599 filed on May 26, 2015, for which priority is claimed under 35 U.S.C. § 120; and this application claims priority of U.S. Provisional Application No. 62/003,262 filed on May 27, 2014 under 35 U.S.C. § 119(e), the entire contents of all of which are hereby incorporated by reference.

REFERENCE TO RELATED APPLICATION

This application claims the right of priority based on U.S. provisional application Ser. No. 62/003,262, filed on May 27, 2014. The entire content of the application is hereby incorporated by reference.

BACKGROUND

Technical Field

The present disclosure relates to a light-emitting device, and more particularly to a light-emitting device disposed on a heat-dissipating structure.

Description of the Related Art

The light-emitting diodes (LEDs) of the solid-state lighting elements have the characteristics of low power consumption, low heat generation, long operational life, shockproof, small volume, quick response and good optoelectrical property like light emission with a stable wavelength so the LEDs have been widely used in household appliances, indicator light of instruments, and optoelectrical products, etc.

When a current is applied to an LED, the LED can emit light and usually generates heat. If the heat is not efficiently dissipated, the performance of LED may be adversely affected.

SUMMARY OF THE DISCLOSURE

The present disclosure provides a light-emitting device. The light-emitting device includes a heat-dissipating structure having a first part and a second part separated from the first part, a light-emitting unit including a light-emitting element with a first pad formed on the first part, a first transparent enclosing the light-emitting element and having a sidewall; and an adhesive material covering a portion of the sidewall.

BRIEF DESCRIPTION OF THE DRAWING

The accompanying drawings are included to provide easy understanding of the application, and are incorporated herein and constitutes a part of this specification. The drawings illustrate the embodiments of the application and, together with the description, serves to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure in accordance with the drawings.

Figure 1A:
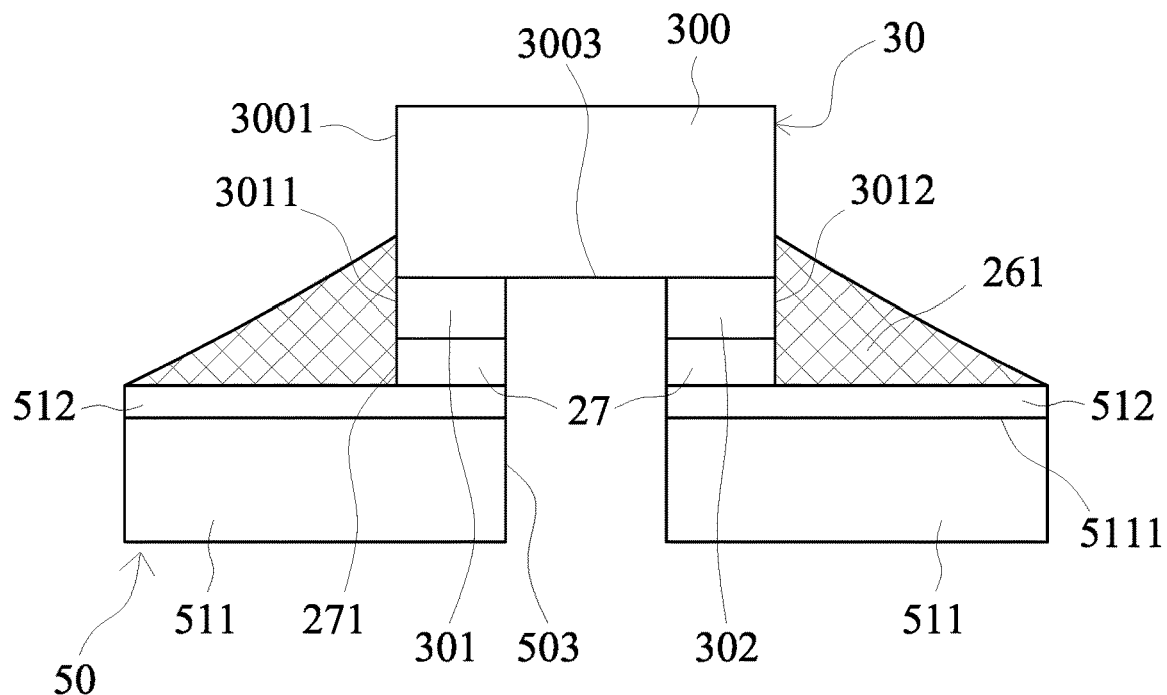
FIG. 1A is a cross-sectional view of a light-emitting device in accordance with an embodiment of the present invention.

FIG. 1A show a cross-sectional view of a light-emitting device in accordance with an embodiment of the present invention. The light-emitting device comprises a heat-dissipating structure 50 and a light-emitting unit 30 disposed on the heat-dissipating structure 50. The heat-dissipating structure 50 includes two parts 511 and two metal layers 512 formed on upper surfaces 5111 of the two parts 511, respectively. The two parts 511 are spaced apart from each other, thereby forming a space 503 therebetween. The metal layer 512 is made of one or more metallic materials. The metallic material includes but not limited to Al, Cu, Au, Ag, Sn, Ti, Ni, and an alloy thereof. The part 511 is made of a conductive material or an insulating material. The conductive material is made of one or more metallic materials as described above. The insulating material is made of a thermosetting epoxy resin which has a triazine derived epoxy resin as its major component or a thermosetting silicone resin. The insulating material can optionally include one or more reflective materials in the thermosetting epoxy resin. The reflective material includes but not limited to $TiO_2$, $K_2TiO_3$, $ZrO_2$, ZnS, ZnO, $SiO_2$, and MgO.

The light-emitting unit 30 is a flip-chip, and has a light-emitting body 300 and two bonding pads 301, 302 mounted on the two metal layers 512 of the heat-dissipating structure 50, respectively, through a bump 27 (solder bump or gold bump). In other embodiment, the light-emitting unit 30 can be mounted on the heat-dissipating structure 50 through eutectic bonding or a conductive adhesive material (for example, through Anisotropic Conductive Paste or Anisotropic conductive adhesive material).

An adhesive material 261 is provided between the light-emitting unit 30 and the heat-dissipating structure 50 to enhance the mechanical strength therebetween. The adhesive material 261 covers a portion of a sidewall 3001 of the light-emitting body 300 without covering the entire sidewall of the light-emitting body 300. In addition, the adhesive material 261 further covers entire side surfaces 3011, 3012 of the bonding pads 301, 302 and entire side surfaces 271 of the bump 27. The adhesive material 261 is made of an insulation material including but not limited to silicone, epoxy, polyimide (PI), BCB, perfluorocyclobutane (PFCB), SU8, acrylic resin, polymethyl methacrylate (PMMA), polyethylene terephthalate (PET), polycarbonate (PC), polyetherimide, and fluorocarbon polymer. In one embodiment, the adhesive material 261 can include a plurality of heat-conductive particles dispersed therein (not shown). The heat-conductive particles are made of one or more conductive materials. The conductive material is such as gold, silver, aluminum, diamond, diamond-like carbon, grapheme, graphite, carbon nanotube, boron nitride, silicon carbide, beryllium oxide, and aluminum nitride. The adhesive material 261 can be transparent or translucent.

Figure 1B:
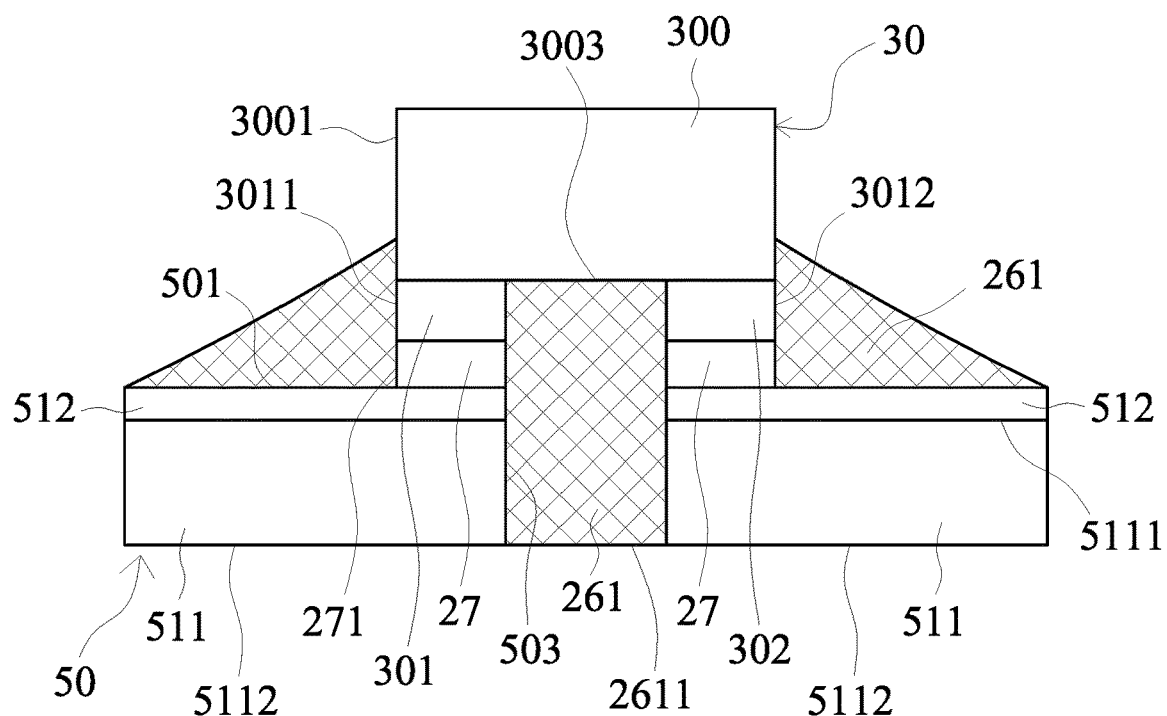
FIG. 1B is a cross-sectional view of a light-emitting device in accordance with an embodiment of the present invention.

FIG. 1B shows a cross-sectional view of a light-emitting device in accordance with an embodiment of the present invention. As shown in FIG. 1B, the adhesive material 261 can also be further provided between the bonding pad 301 and the bonding pad 302 to cover a bottom surface 3003 of the light-emitting body 30 and the space 503 in the heat-dissipating structure 50. In this embodiment, the part 511 has a top surface 5111 and a bottom surface 5112. The space 503 is fully filled with the adhesive material 261, that is, a lower surface 2611 of the adhesive material 261 can be coplanar with a bottom surface 5112 of the part 511. In other embodiment, the space 503 is partially filled with the adhesive material 261, that is, the lower surface 2611 is between the top surface 5111 and the bottom surface 5112. In other embodiment, the metal layer 512 can be further formed on the bottom surface 5112 opposite to the top surface 5111.

Figure 1C:
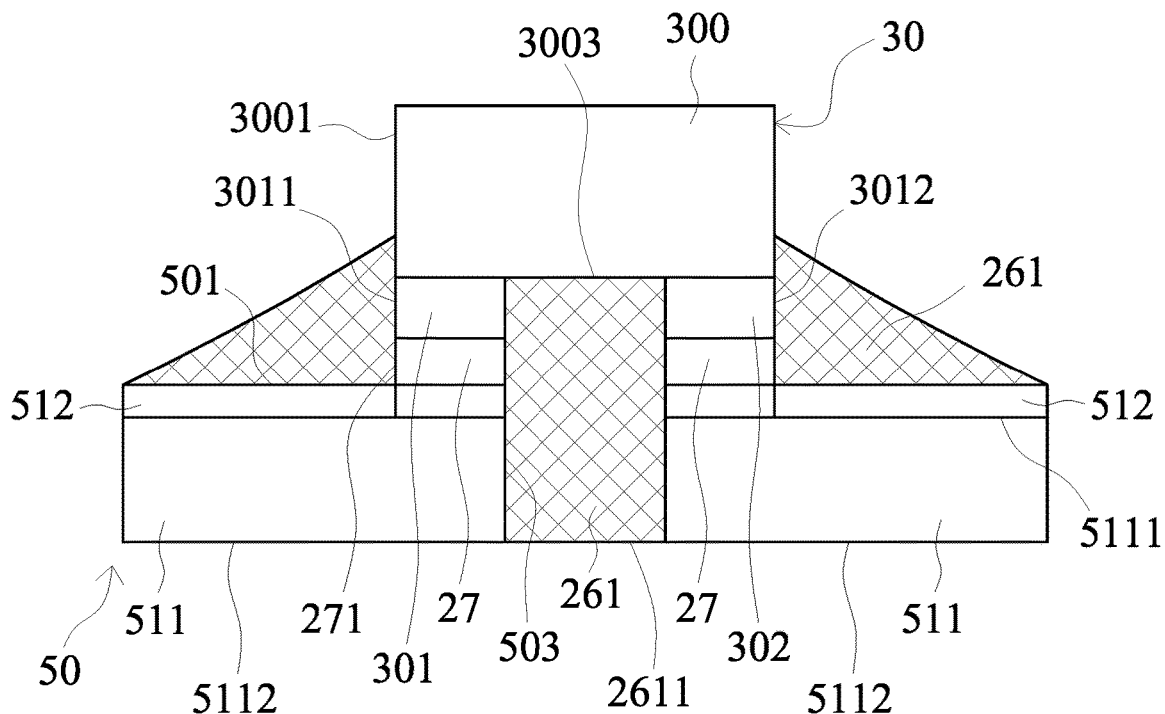
FIG. 1C is a cross-sectional view of a light-emitting device in accordance with an embodiment of the present invention.

FIG. 1C shows a cross-sectional view of a light-emitting device in accordance with an embodiment of the present invention. As shown in FIG. 1C, a reflective layer 265 is formed between the adhesive material 261 and the heat-dissipating structure 50 for reflecting the light emitted by the light-emitting unit 30 upwardly. The reflective layer 265 can be a single layer or a multi-layer. If the reflective layer 265 is a single layer, the reflective layer 265 can be made of a conductive material or an insulating material. The conductive material includes but not limited to Ag, Al, and Au. The insulating material is such as a white paint which includes a plurality of diffusion particles dispersed in silicone-based or epoxy-based matrix. The diffusion particle is made of one or more materials. The material is such as $TiO_2$, ZnO, and $ZrO_2$. If the reflective layer 265 is a multi-layer, the reflective layer 265 can include a plurality of metal oxide layers (made of one or more materials, such as $SiO_2$, $Al_2O_3$ and $Si_3N_4$) or semiconductor layers (made of one or more materials, such as GaN, AlGaN, AlInGaN, AlAS, AlGaAs and GaAs) with an alternately-arranged layer structure, such as a Distributed Bragg Reflector structure. Alternatively, the reflective layer 265 can include a plurality of metal layers. The metal layer can be made of one or more reflective metals, such as Ag, Al, Au, Ti, Cr, Ni, and an alloy thereof.

Figure 1D:
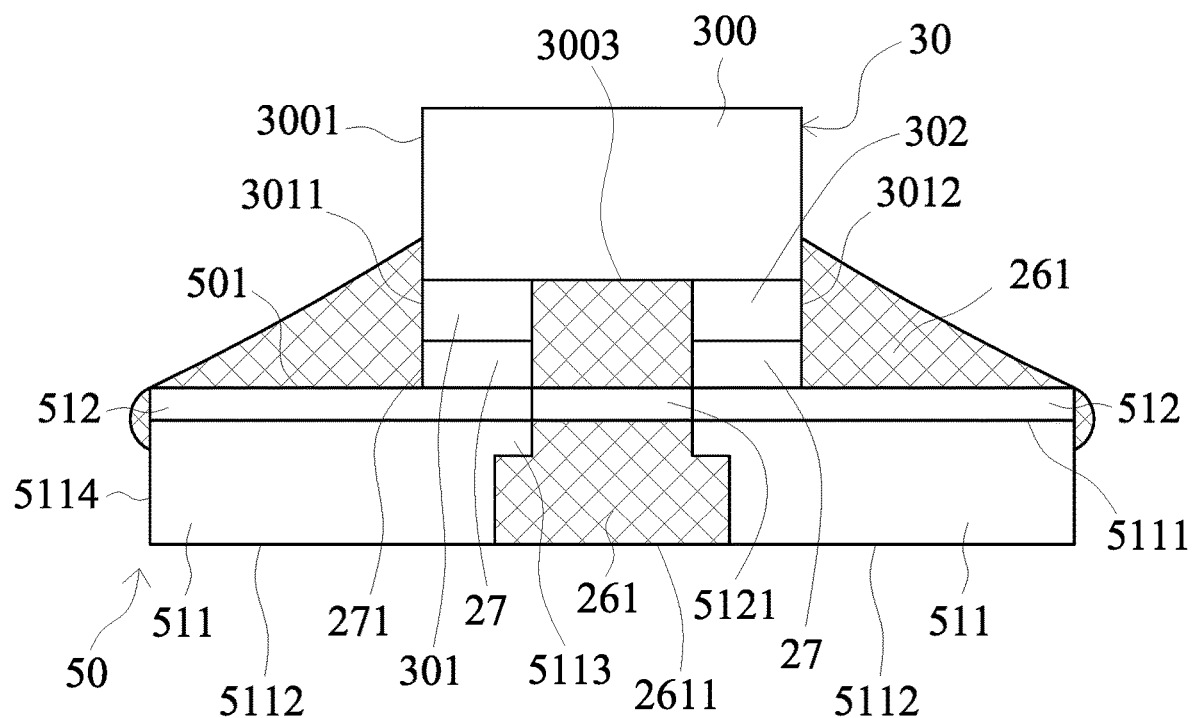
FIG. 1D is a cross-sectional view of a light-emitting device in accordance with a further embodiment of the present invention.

FIG. 1D shows a cross-sectional view of a light-emitting device in accordance with an embodiment of the present invention. As shown in FIG. 1D, Each of the two parts 511 has an extension 5113 sticking out from a portion near the metal layer 512. The extensions 5113 of the two parts 511 face each other in a horizontal direction and space apart by a distance which is smaller than a gap of the two parts 511 beneath the extensions. The distance can be made to spatially correspond to a gap of the bumps 27. However, the distance between the extensions 5113 and the gap of the bumps 27 are not necessarily made equal. The adhesive material 261 can be formed in a space between the parts 511 but not in a space 5121 between the metal layers 512 such that an air gap is formed between the light-emitting body 30 and the adhesive material 261. In addition, the adhesive material 261 can further cover a sidewall 5114 of the part 511 opposite to the protrusion 5113.

Figure 2A:
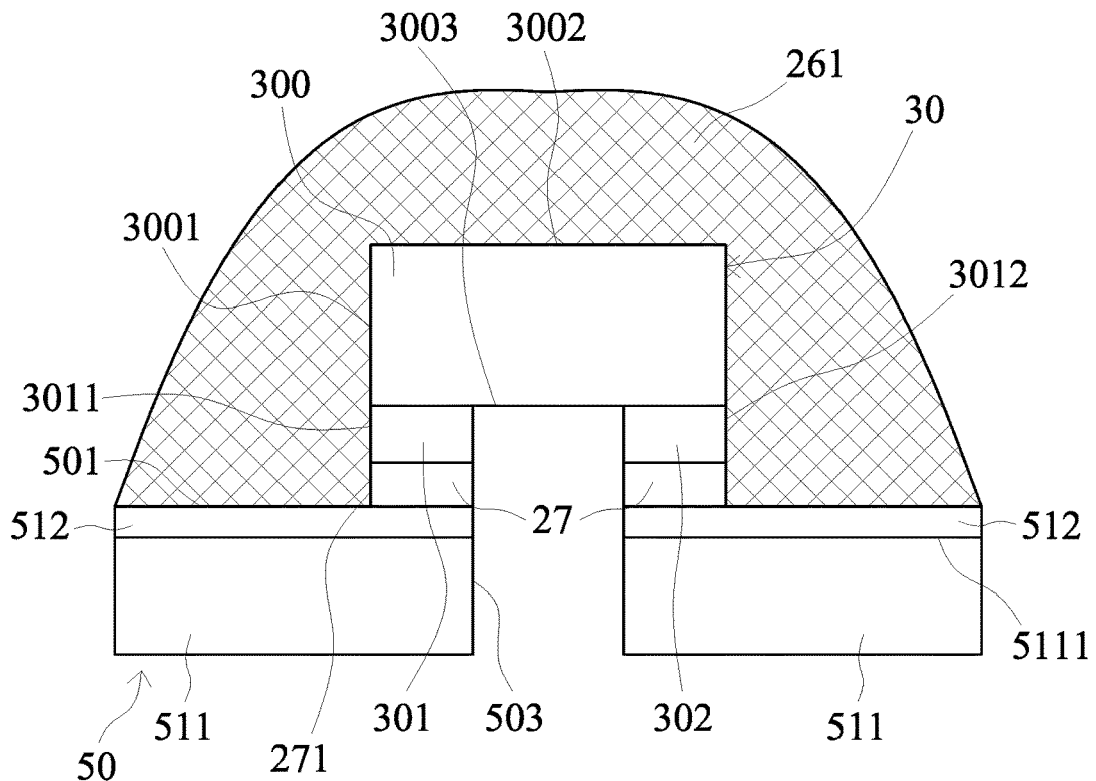
FIG. 2A is a cross-sectional view of a light-emitting device in accordance with an embodiment of the present invention.

FIG. 2A shows a cross-sectional view of a light-emitting device in accordance with an embodiment of the present invention. As shown in FIG. 2A, the adhesive material 261 is optionally formed to enclose the entire sidewalls 3001 and a top surface 3002 of the light-emitting body 300 such that the adhesive material 261 can be used as a lens. A plurality of heat-conductive particles can be also dispersed in the adhesive material 261.

Figure 2B:
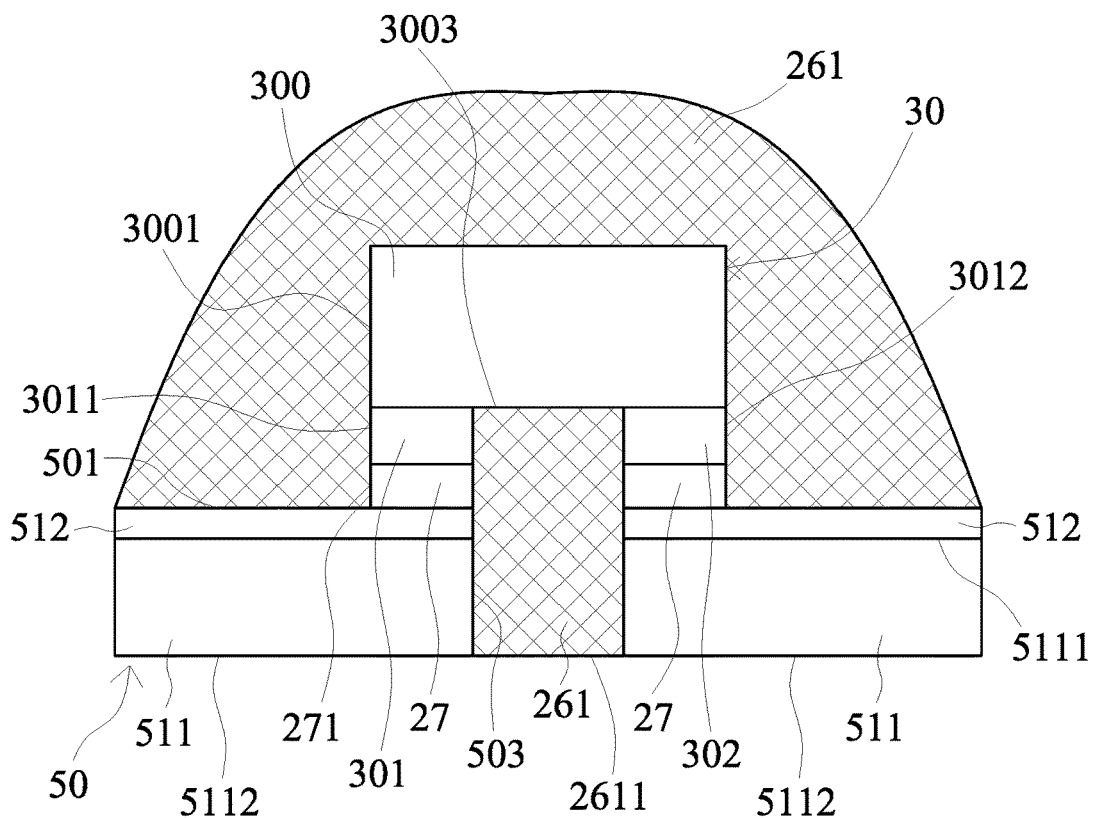
FIG. 2B is a cross-sectional view of a light-emitting device in accordance with an embodiment of the present invention.

FIG. 2B shows a cross-sectional view of a light-emitting device in accordance with an embodiment of the present invention. As shown in FIG. 2B, the adhesive material 261 can be optionally formed between the bonding pad 301 and the bonding pad 302 to cover the bottom surface 3003 of the light-emitting body 30 and filled in the space 503 in the heat-dissipating structure 50. The related descriptions can refer to other paragraphs.

Figure 2C:
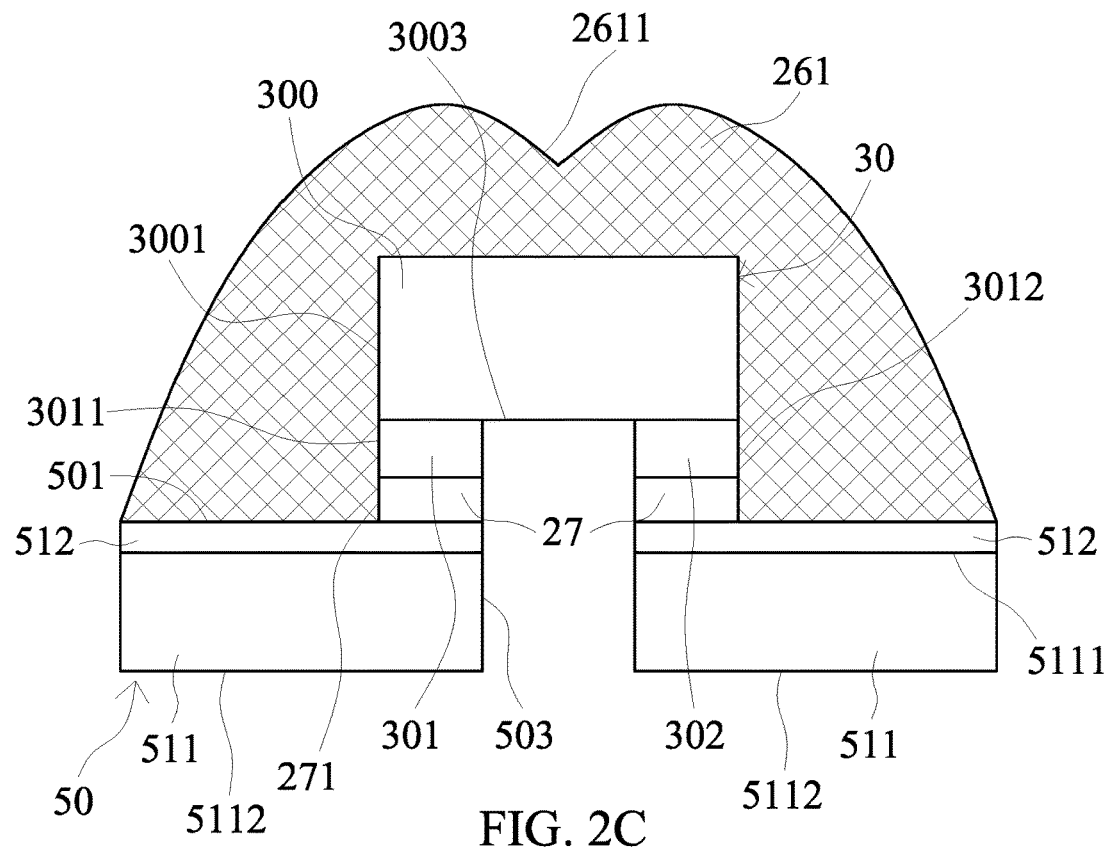
FIG. 2C is a cross-sectional view of a light-emitting device in accordance with an embodiment of the present invention.
Figure 2D:
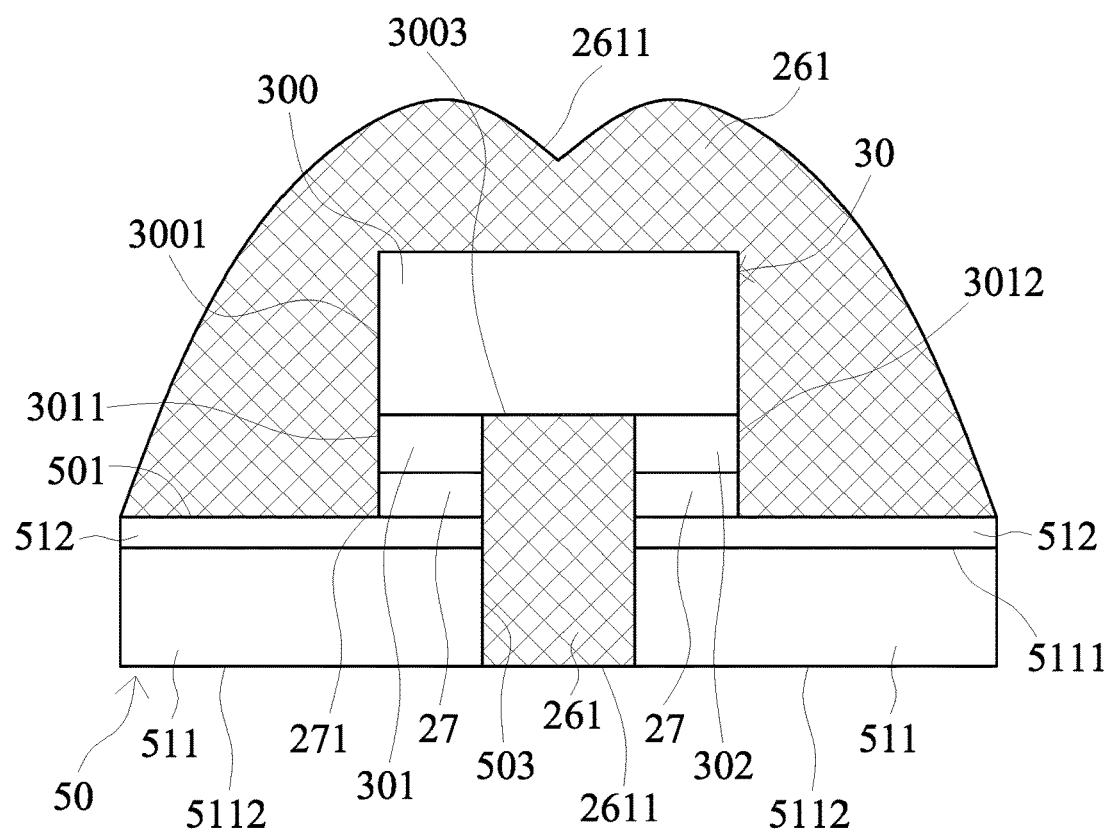
FIG. 2D is a cross-sectional view of a light-emitting device in accordance with an embodiment of the present invention.

FIG. 2C shows a cross-sectional view of a light-emitting device in accordance with an embodiment of the present invention. FIG. 2D show a cross-sectional view of a light-emitting device in accordance with an embodiment of the present invention. FIGS. 2C and 2D illustrate structures similar to those shown in FIGS. 2A and 2B. The adhesive material 261 is formed to possess a recess 2612 at a position right above the light-emitting body 300. In FIG. 2D, the adhesive material 261 is further formed between the bonding pads 301, 302. The adhesive material 261 can be formed in various shapes, depending on actual requirements for achieving a desired light distribution or color over angle (COA).

Figure 3A:
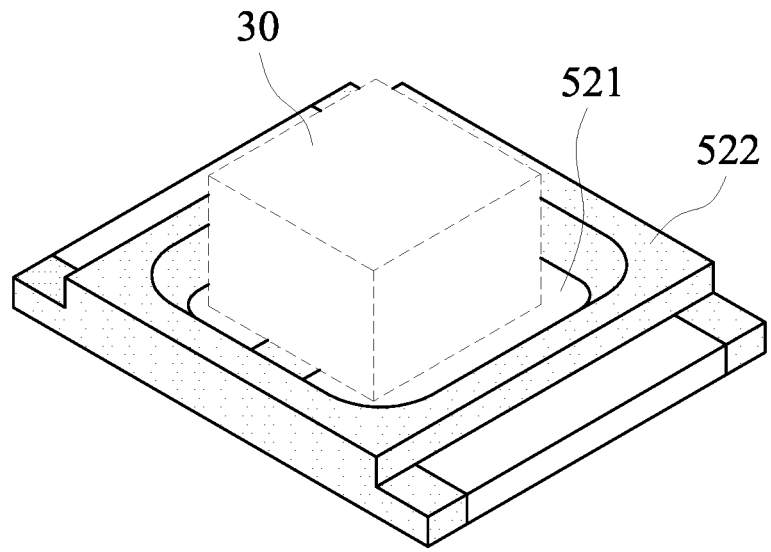
FIG. 3A is a perspective view of a light-emitting device in accordance with an embodiment of the present invention.
Figure 3B:
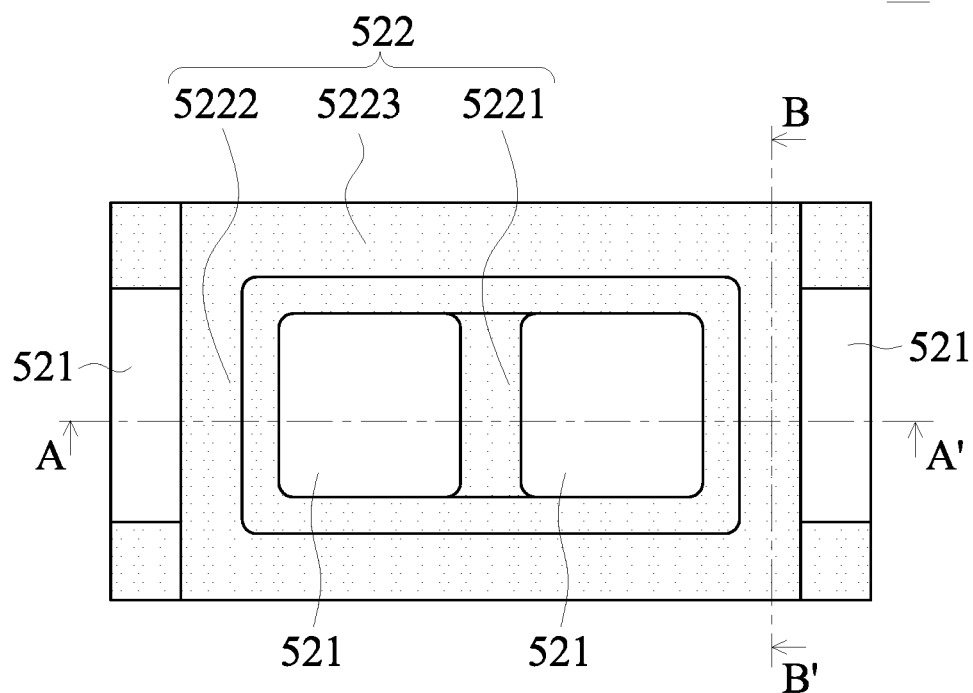
FIG. 3B is a top view of a heat-dissipating structure shown in FIG. 3A.
Figure 3C:
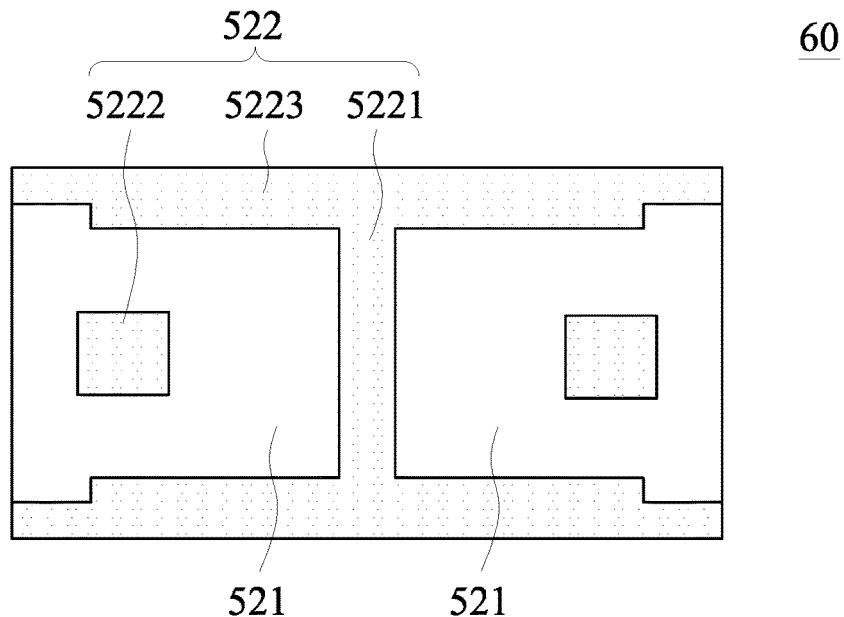
FIG. 3C is a bottom view of a heat-dissipating structure shown in FIG. 3A.
Figure 3D:
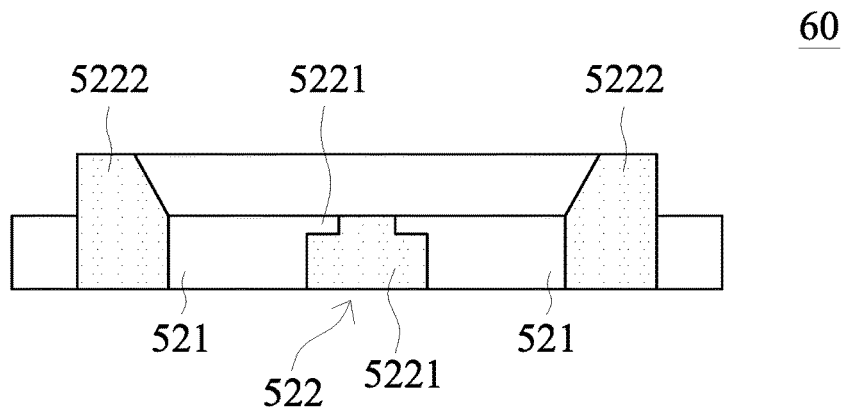
FIG. 3D is a cross sectional view taken along line AA' in FIG. 3B.
Figure 3E:
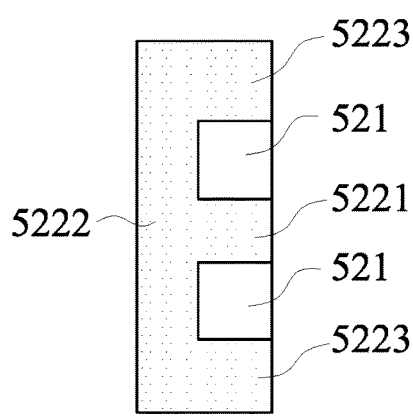
FIG. 3E is a view taken along line BB' in FIG. 3B.

FIG. 3A shows a perspective view of a light-emitting device in accordance with an embodiment of the present invention. The light-emitting device has a heat-dissipating structure 60 and a light-emitting unit 30 (shown in dotted line) disposed on the heat-dissipating structure 60. FIG. 3B illustrates a top view of the heat-dissipating structure 60. FIG. 3C illustrates a bottom view of the heat-dissipating structure 60. FIGS. 3D and 3E illustrate cross-sectional views of the heat-dissipating structure 60. FIG. 3D is a view taken along line AA' of FIG. 3B. FIG. 3E is a view taken along line BB' of FIG. 3B.

As shown in FIGS. 3A, 3B and 3D, the heat-dissipating structure 60 includes two spaced-apart metal parts 521 and an insulating structure 522 provided to clamp the metal parts 521 together. Specifically, the insulating structure 522 has a first portion 5221 between the metal parts 521, and a second portion 5222 extending from a front side of the metal part 521 to a back side of the metal part 521 and penetrating through the entire metal part 521. One of the metal parts 521 has an extension 5211 extending toward the other of the metal parts 521.

As shown in FIGS. 3A, 3B and 3E, the insulating structure 522 has a third portion 5223 formed to cover a sidewall of the metal part 521. In this embodiment, the first portion 5221, the second portion 5222, and the third portion 5223 are integratedly formed to make the insulating structure 522 a single object.

The metal part 521 is made of one or more metallic materials. The metallic material includes but not limited to Al, Cu, Au, Ag, Sn, Ti, Ni, and an alloy thereof. The insulating structure 522 is made of a thermosetting epoxy resin which has a triazine derived epoxy resin as its major component or a thermosetting silicone resin. The insulation structure 522 can optionally include one or more reflective materials in the thermosetting epoxy resin. The reflective material includes but not limited to $TiO_2$, $K_2TiO_3$, $ZrO_2$, ZnS, ZnO, and MgO.

FIGS. 4A-4F, 5A-7B show cross-sectional views of the light-emitting units 30 shown in FIGS. 1A-3A in accordance to the aforesaid embodiments of present invention. FIG. 4G shows a cross-sectional view of the light-emitting unit of FIG. 4A disposed on the heat-dissipating structure 50.

Figure 4A:
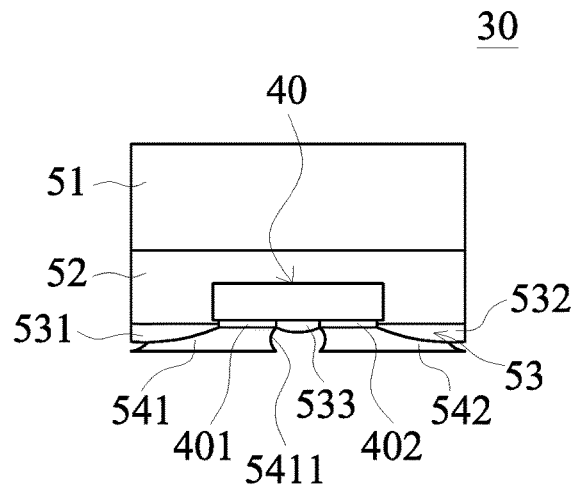
FIGS. 4A-4F are cross-sectional views of the light-emitting units in accordance to the aforesaid embodiments of present invention.

As shown in FIG. 4A, the light-emitting unit 30 includes a light-emitting element 40 with a first electrode 401 and a second electrode 402, a first transparent structure 52 enclosing the light-emitting element 40, a second transparent structure 51 formed on the first transparent structure 52. A reflective layer 53 is formed on the first transparent structure 52 at a side opposite to the second transparent structure 51, and has a first portion 531, a second portion 532, and a third portion 533 between the first electrode 401 and the second electrode 402. The first portion 531 is adjacent to the first electrode 401 and has a height gradually increasing in a direction from the first electrode 401 to an edge of the first transparent structure 52. The second portion 532 is adjacent the second electrode 402 and has a shape similar to that of the first portion 531, therefore, the second portion 532 has a height gradually increasing in the direction from the second electrode 402 to another edge of the first transparent structure 52. The third portion 533 has a convex shape with a central region bulged outwards in a direction far away from the light-emitting element 40. In this embodiment, a first pad 541 is formed on the first portion 531 and the first electrode 401 and electrically connected to the first electrode 401. Specifically, the first pad 541 has a footprint area larger than that of the first electrode 401, thereby increasing a contacting area with the bump 27 (as shown in FIG. 1A). A second pad 542 is formed on the second portion 532 and the second electrode 402 and electrically connected to the second electrode 402. Likewise, the second pad 542 has a footprint area larger than that of the second electrode 302, thereby increasing a contacting area with the bump 27 (as shown in FIG. 1A). The first pad 541 has a shape similar to that of the second pad 542 and has a sidewall 5411 adjacent to the second pad 542. The sidewall 5411 has a concave surface.

Specifically, the light-emitting body 300 in FIG. 1A includes the light-emitting element 40 with the first electrode 401 and the second electrode 402, the first transparent structure 52, the second transparent structure 51, and the reflective layer 53 as shown in FIG. 4A. The first pad 541 and the second pad 542 are used as the bonding pad 301 and the bonding pad 302, respectively (as shown in FIGS.1A-3B), for mounting on the heat-dissipating structure 50.

Referring to FIG. 4G, the adhesive material 261 cover a portion of a sidewall of the first transparent structure 52 without covering a sidewall of the second transparent structure 51. In addition, since a gap 43 can exist between the first portion 531 of the reflective layer 53 and the first pad 541, the adhesive material 261 can be filled into the gap. Alternatively, the adhesive material 261 can cover the entire sidewall of the first transparent structure 52 and only a portion of the sidewall of the second transparent structure 51 for enhancing a mechanical strength between the light-emitting unit 30 and the heat-dissipating structure 50.

Figure 4B:
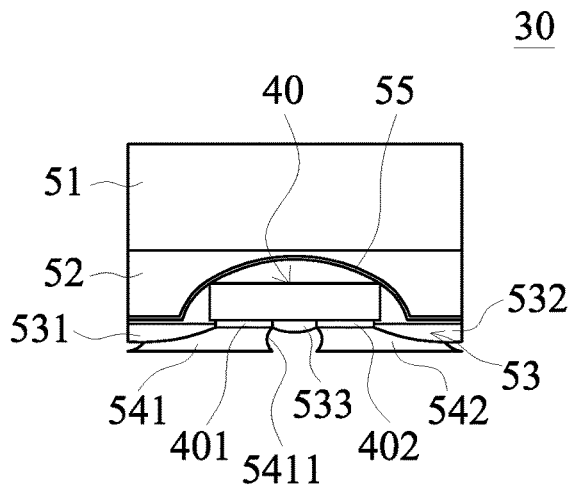

As shown in FIG. 4B, the light-emitting unit 30 has a structure similar to that shown in FIG. 4A, except that a phosphor layer 55 is provided within the first transparent structure 52. The phosphor layer 55 includes a plurality of phosphor particles dispersed therein to absorb and convert a first light emitted by the light-emitting element 40 to a second light with a peak wavelength different from that the first light. The phosphor particle includes, but is not limited to, yellow-greenish phosphor and red phosphor. The yellow-greenish phosphor includes aluminum oxide (such as YAG or TAG), silicate, vanadate, alkaline-earth metal selenide, or metal nitride. The red phosphor includes silicate, vanadate, alkaline-earth metal sulfide, metal nitride oxide, a mixture of tungstate and molybdate. The first light can be mixed with the second light to produce a white light. The lighting apparatus 100 has a color temperature of 2200K-6500K (ex. 2200K, 2400K, 2700K, 3000K, 5700K, 6500K) and a color point (CIE x, y) is within a seven-step MacAdam ellipse.

Figure 4C:
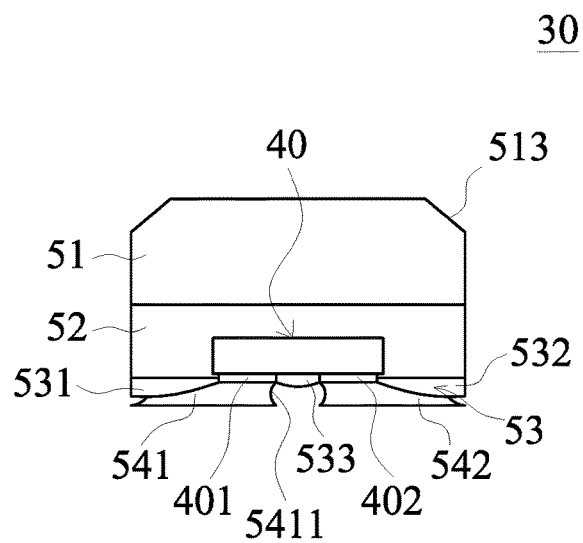

As shown in FIG. 4C, the light-emitting unit 30 has a structure similar to that shown in FIG. 4A, except that the second transparent structure 51 has a chamfer 518.

Figure 4D:
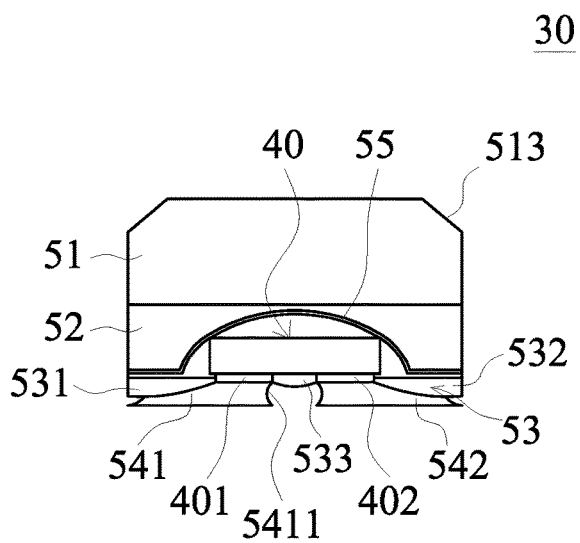

As shown in FIG. 4D, the light-emitting unit 30 has a structure similar to that shown in FIG. 4C, except that a phosphor layer 55 is provided within the first transparent structure 52. The description of the phosphor layer 55 can refer to other embodiments.

Figure 4E:
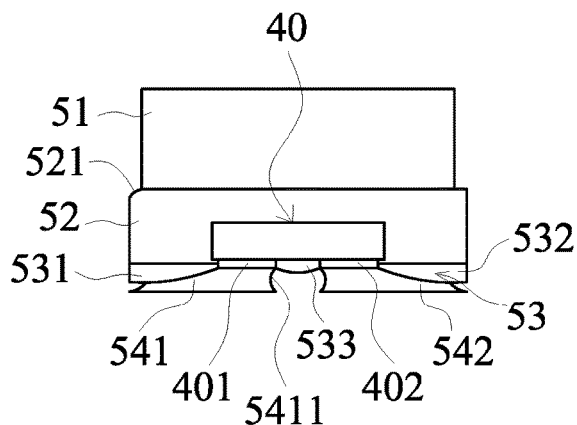

As shown in FIG. 4E, the light-emitting unit 30 has a structure similar to that shown in FIG. 4A, except that the first transparent structure 52 extends beyond the second transparent structure 51 and has an arc 521 close to the second transparent structure 51.

Figure 4F:
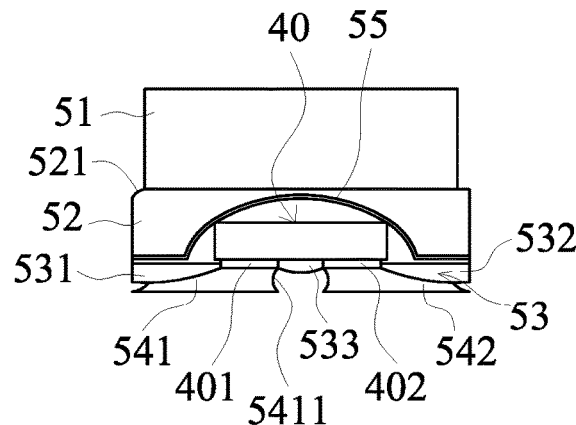
Figure 4G:
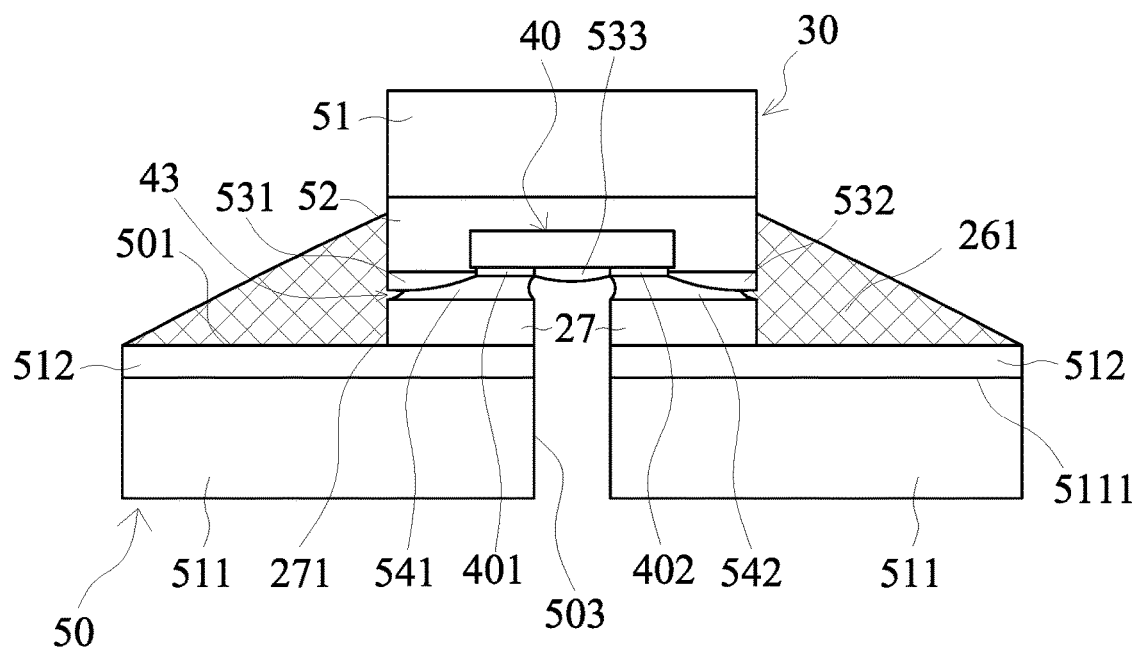
FIG. 4G is a cross-sectional view of the light-emitting unit of FIG. 4A disposed on a heat-dissipating structure unit.
Figure 5A:
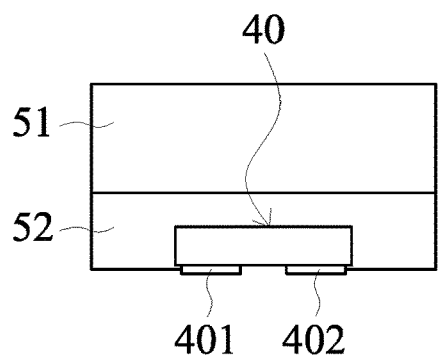
FIGS. 5A-5F, 6A-6H, 7A, and 7B are cross-sectional views of the light-emitting units in accordance to the aforesaid embodiments of present invention.
Figure 5B:
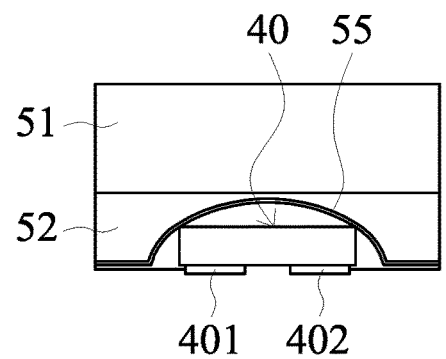
Figure 5C:
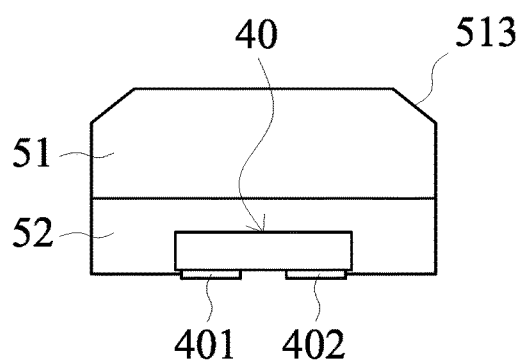
Figure 5D:
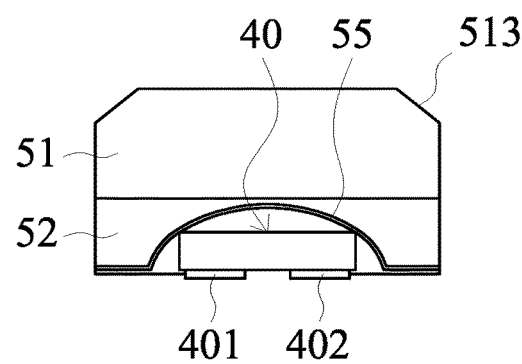
Figure 5E:
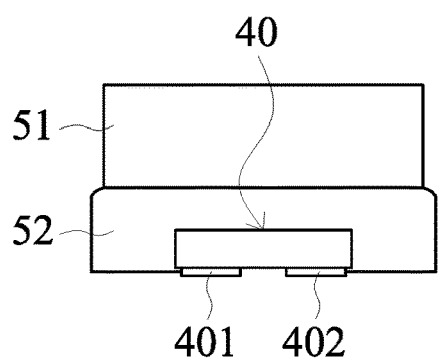
Figure 5F:
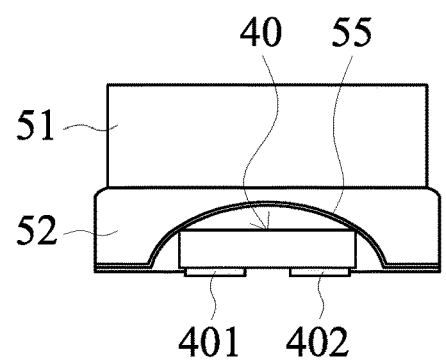

As shown in FIG. 4F, the light-emitting unit 30 has a structure similar to that shown in FIG. 4E, except that a phosphor layer 55 is provided within the first transparent structure 52.

FIGS. 5A-5F have structures similar to those shown in FIGS. 4A-4F, except that the light-emitting units are devoid of the reflective layer and the pads. The first electrode 401 and the second electrode 402 are used as the bonding pads 301, 302, respectively, for mounting on the heat-dissipating structure 50.

Figure 6A:
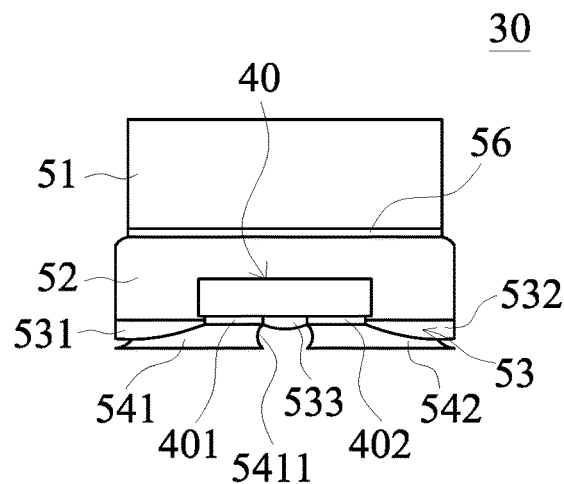
Figure 6B:
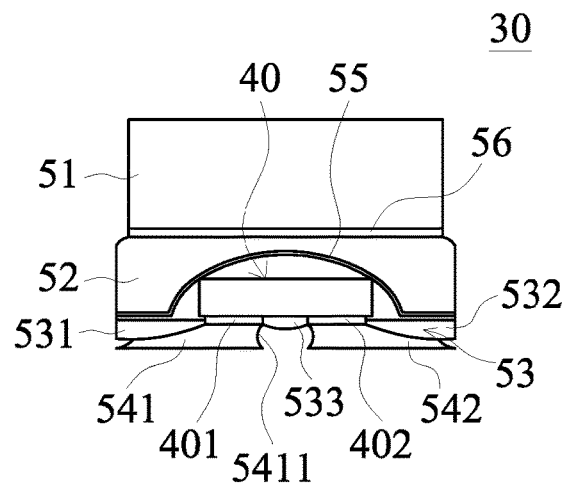

FIGS. 6A and 6B have structures similar to those shown in FIGS. 4E and 4F, except that a reflective structure 56 is formed between the first transparent structure 52 and the second transparent structure 51. The reflective structure 56 can be a single layer or a multi-layer. If the reflective structure 56 is a single layer, the reflective structure 56 can be made of a conductive material or an insulating material. The conductive material includes but not limited to Ag, Al, and Au. The insulating material is such as a white paint which includes a plurality of diffusion particles dispersed in silicone-based or epoxy-based matrix. The diffusion particle is made of one or more materials. The material is such as $TiO_2$, ZnO, and $ZrO_2$. If the reflective structure 56 is a multi-layer, the reflective structure 56 can include a plurality of metal oxide layers (made of one or more materials, such as $SiO_2$, $Al_2O_3$ and $Si_3N_4$) or semiconductor layers (made of one or more materials, such as GaN, AlGaN, AlInGaN, AlAS, AlGaAs and GaAs) with an alternately-arranged layer structure, such as a Distributed Bragg Reflector structure. Alternatively, the reflective structure 56 can include a plurality of metal layers. The metal layer can be made of one or more reflective metals, such as Ag, Al, Au, Ti, Cr, Ni, and an alloy thereof.

Figure 6C:
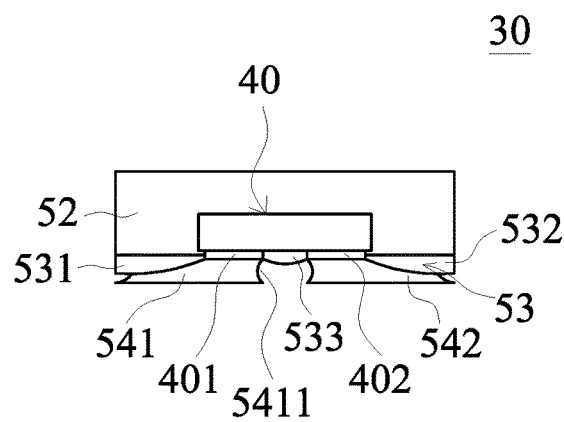
Figure 6D:
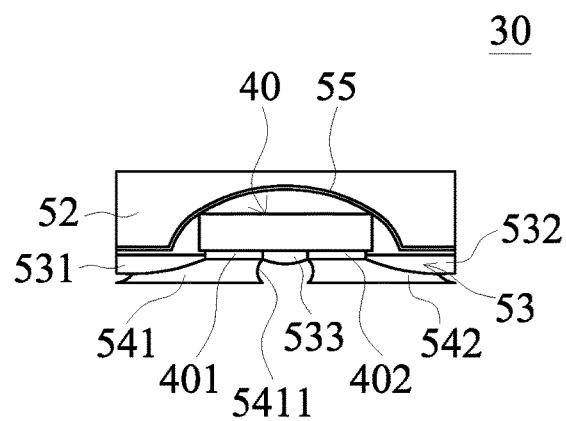

FIGS. 6C and 6D have structures similar to those shown in FIGS. 4A and 4B, except that the light-emitting units are devoid of the second transparent structure 51 formed on the first transparent structure 52.

Figure 6E:
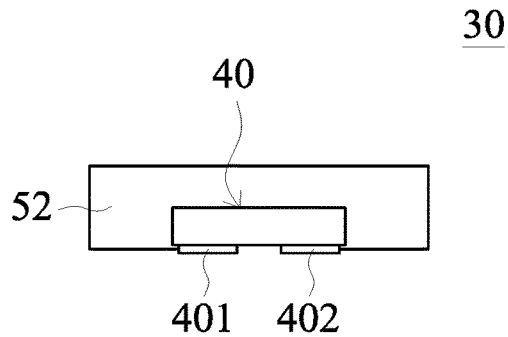
Figure 6F:
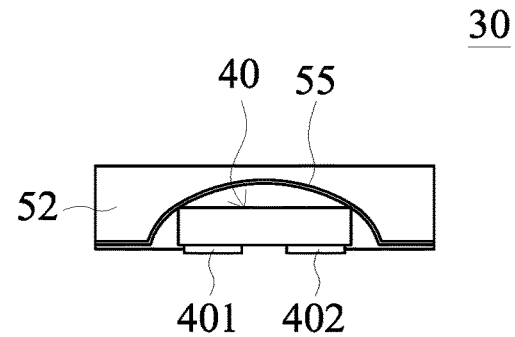

FIGS. 6E and 6F have structures similar to those shown in FIGS. 6C and 6D, except that the light-emitting units are devoid of the reflective layer and the pads.

Figure 6G:
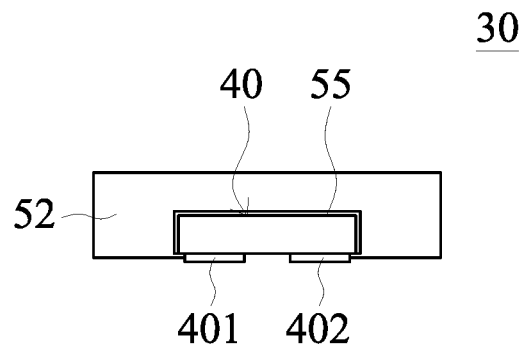

FIG. 6G has a structure similar to that in FIG. 6F, except that the phosphor layer 55 is conformably formed on the light-emitting element 40, that is, the phosphor layer 55 is formed along the contour of the light-emitting element 40.

Figure 6H:
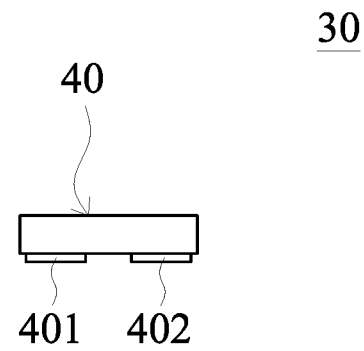

FIG. 6H has a structure similar to that in FIG. 6E, except that the first transparent structure 52 is not provided.

Figure 7A:
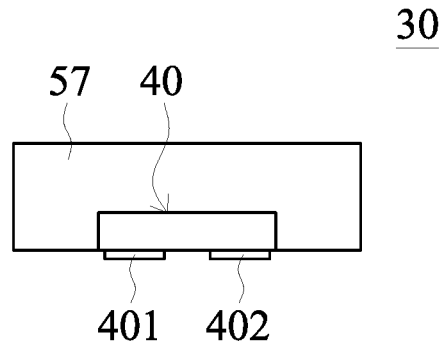

As shown in FIG. 7A, a phosphor structure 57 encloses the light-emitting element 40. The phosphor structure 57 includes a plurality of phosphor particles dispersed in a matrix body. Alternatively, the phosphor structure 1413 can further include diffusing particles. The matrix body includes epoxy, silicone, PI, BCB, PFCB, Su8, acrylic resin, PMMA, PET, PC, or polyetherimide. The diffusing particle includes titanium oxide, zirconium dioxide, zinc oxide, or aluminum oxide. The description of the phosphor particle can refer to other embodiments.

Figure 7B:
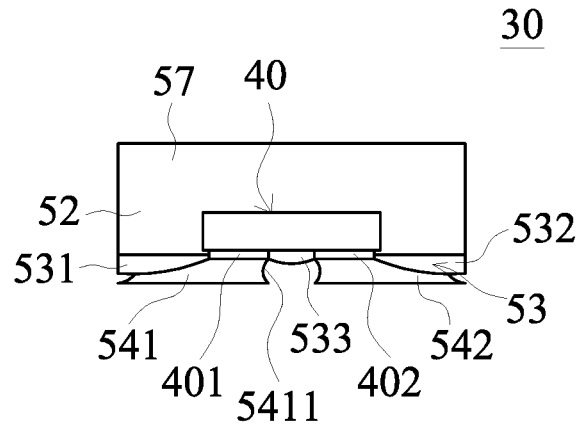

FIG. 7B has a structure similar to that shown in FIG. 7A, except that the reflective layer 53 and the pads 541, 542 are further provided.

Figure 8A:
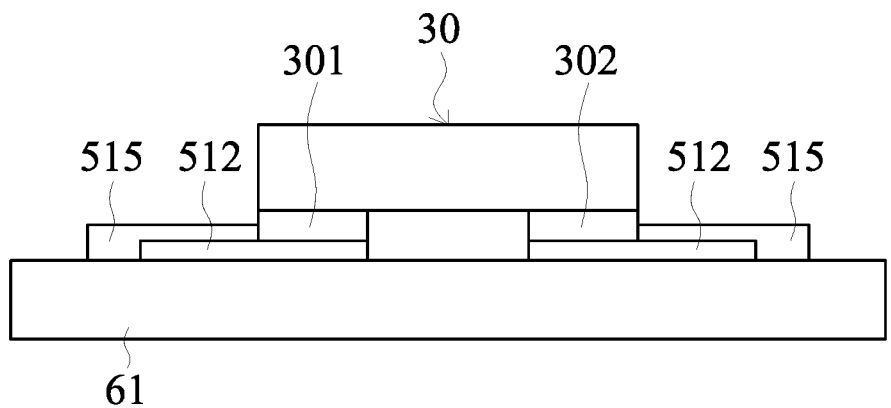
FIGS. 8A-8B show cross-sectional views of a light-emitting device in accordance to other embodiments.
Figure 8B:
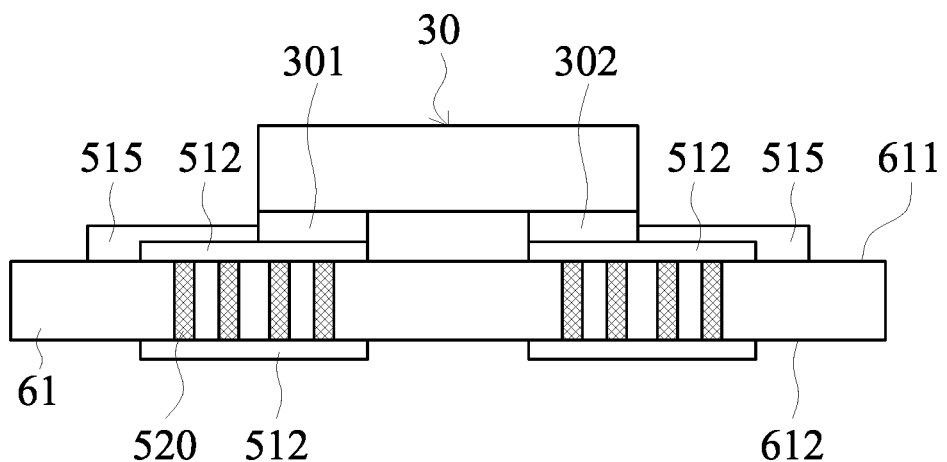

FIGS. 8A-8B illustrate cross-sectional views of a light-emitting device in accordance to another embodiments. The light-emitting device comprises a carrier 61, two spaced-apart metal layers 512 formed on a top surface 611 of the carrier 61, and the light-emitting unit 30. The light-emitting unit 30 has a first bonding pad 301 and a second bonding pad 302, respectively, mounted on the two spaced-apart metal layers 512 through a bump 27 such as solder bump or gold bump. In other embodiment, the light-emitting unit 30 can be mounted on the two spaced-apart metal layers 512 through eutectic bonding or a conductive adhesive material (for example, through anisotropic conductive paste or anisotropic conductive adhesive material).

A reflective layer 515 is optionally formed on the metal layers 512 or the carrier 61 for reflecting the light emitted by the light-emitting unit 30. The reflective layer 515 includes a single layer or a multi-layer. If the reflective layer 515 is a single layer, the single layer can be made of a conductive material, or an insulating material. The conductive material includes but not limited to Ag, Al, and Au. The insulating material is such a white paint which includes a plurality of diffusion particles dispersed in a silicone-based or epoxy-based matrix. The diffusion particle is made of one or more materials. The material is such as $TiO_2$, ZnO, and $ZrO_2$. If the reflective layer 515 is a multi-layer, the reflective layer 515 can include a plurality of metal oxide layers (made of one or more materials, such as $SiO_2$, $Al_2O_3$ and $Si_3N_4$) or semiconductor layers (made of one or more materials, such as GaN, AlGaN, AlInGaN, AlAS, AlGaAs and GaAs) with an alternately-arranged layer structure, such as a Distributed Bragg Reflector structure. Alternatively, the reflective layer 515 can include a plurality of metal layers. The metal layer can be made of one or more reflective metals, such as Ag, Al, Au, Ti, Cr, Ni, and an alloy thereof.

In top view, the metal layer 512 has a surface area at least two times greater than an area of the corresponding first bonding pad 301 or the second bonding pad 302. The carrier 61 is made of a thermosetting epoxy resin which has a triazine derived epoxy resin as its major component or a thermosetting silicone resin. The carrier 60 can optionally include one or more reflective materials disposed therein. The reflective material includes but not limited to $TiO_2$, $K_2TiO_3$, $ZrO_2$, ZnS, ZnO, and MgO.

As shown in FIG. 8B, two additional spaced-apart metal layers 512 can be optionally formed on a bottom surface 612 at a position corresponding to the spaced-apart metal layers 512 on the top surface 611. A plurality of conductive via holes 520 are formed within and to penetrate the carrier 60 for electrically connecting the metal layer 512 on the top surface 611 with the metal layers 512 on the bottom surface 612.

As shown in FIG. 8A, heat generated from the light-emitting unit 30 is dissipated by the metal layer 512 to the environment. On the contrary, ss shown in FIG. 10B, by the via holes 520 connecting the metal layer 512 on the top surface 611 with the metal layer 512 on the bottom surface 612, heat can be dissipated not only by the metal layer 512 on the top surface 611 but also by the metal layer 512 on the bottom surface 612. Accordingly, the total heat-dissipating area is enlarged, compared to the conditions shown in FIG. 10A, for facilitating heat dissipation from the light-emitting unit 30 to the environment.

The foregoing description has been directed to the specific embodiments of this invention. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device comprising:
   a heat-dissipating structure including a first part and a second part, the first part being separated from the second part;
   a first metal layer and a second metal layer, the second metal layer being separated from the first metal layer, the first metal layer being placed on the first part, the second metal layer being placed on the second part;
   a light-emitting unit having outer sidewalls and a top surface, the light-emitting unit including:
     a light-emitting element having a first electrode and a second electrode, the first electrode being separated from the second electrode;
     a transparent structure enclosing the light-emitting element;
     a first pad electrically connected to the first electrode;
     a second pad electrically connected to the second electrode; and
     a reflective structure formed on the transparent structure, wherein the first part and second part, the first metal layer and second metal layer, and the light-emitting unit collaboratively define a space; and an adhesive structure placed between the light-emitting unit and the heat-dissipating structure, a first part of the adhesive structure being filled in the space, and a second part of the adhesive structure covering the outer sidewalls and the top surface of the light-emitting unit to form a dome shape.

2. The light-emitting device of claim 1, wherein the reflective structure is a single layer.

3. The light-emitting device of claim 1, wherein the reflective structure includes a plurality of metal layers.

4. The light-emitting device of claim 1, wherein the adhesive structure is made of an insulation material.

5. The light-emitting device of claim 1, wherein the light-emitting unit is a flip-chip.

6. A light-emitting device comprising:
- a heat-dissipating structure including a first part and a second part separated from the first part;
- a first metal layer and a second metal layer separated from the first metal layer, the first metal layer being placed on the first part and the second metal layer being placed on the second part;
- a light-emitting unit having outer sidewalls and a top surface, including a first pad and a second pad, the first pad being separated from the second pad, wherein the first part and second part, the first metal layer and second metal layer, and the light-emitting unit collaboratively define a space; and
- an adhesive structure placed between the light-emitting unit and the heat-dissipating structure, a first part of the adhesive structure being filled in the space and a second part of the adhesive structure covering the outer sidewalls and the top surface of the light-emitting unit to form a recess at a position right above and vertically aligned with the light-emitting unit.

7. The light-emitting device of claim 6, wherein the adhesive structure includes a plurality of heat-conductive particles.

8. The light-emitting device of claim 6, wherein the adhesive structure is transparent or translucent.

9. The light-emitting device of claim 6, wherein the adhesive structure is made of an insulation material.

10. The light-emitting device of claim 6, wherein the light-emitting unit is a flip-chip.

* * * * *